US009121897B2

United States Patent
Lo

(10) Patent No.: US 9,121,897 B2
(45) Date of Patent: Sep. 1, 2015

(54) THIN HEATING DEVICE

(71) Applicant: ADATA TECHNOLOGY CO., LTD., New Taipei (TW)

(72) Inventor: Mao-Yuan Lo, New Taipei (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 236 days.

(21) Appl. No.: 13/897,343

(22) Filed: May 17, 2013

(65) Prior Publication Data

US 2014/0253156 A1 Sep. 11, 2014

(30) Foreign Application Priority Data

Mar. 6, 2013 (TW) .............................. 102107810 A

(51) Int. Cl.
*G01R 31/10* (2006.01)
*G01R 31/28* (2006.01)
*H01R 12/70* (2011.01)
*H01R 12/71* (2011.01)
*H05K 7/14* (2006.01)

(52) U.S. Cl.
CPC ........ *G01R 31/2875* (2013.01); *G01R 31/2884* (2013.01); *H01R 12/7017* (2013.01); *H01R 12/7082* (2013.01); *H01R 12/716* (2013.01); *H05K 7/1431* (2013.01)

(58) Field of Classification Search
CPC .......... G01R 31/2875; G01R 31/2884; H01R 12/7017; H01R 12/7082; H01R 12/716; H05K 7/1431
USPC ................. 324/378, 403, 415, 425, 500, 537, 324/750.01, 750.03, 750.05, 750.06, 324/750.07; 439/64, 79, 326, 328, 377
See application file for complete search history.

(56) References Cited

U.S. PATENT DOCUMENTS

| | | | | |
|---|---|---|---|---|
| 6,227,871 | B1 * | 5/2001 | Bender | 439/67 |
| 2003/0077923 | A1 * | 4/2003 | Matsuo | 439/67 |
| 2005/0099391 | A1 * | 5/2005 | Nishino et al. | 345/161 |
| 2007/0019709 | A1 * | 1/2007 | Wang | 374/208 |
| 2007/0259552 | A1 * | 11/2007 | Peng et al. | 439/326 |
| 2009/0256582 | A1 * | 10/2009 | Sung | 324/755 |
| 2010/0259278 | A1 * | 10/2010 | Chiang et al. | 324/537 |
| 2014/0198471 | A1 * | 7/2014 | Kajio et al. | 361/804 |

* cited by examiner

*Primary Examiner* — Huy Q Phan
*Assistant Examiner* — Raul Rios Russo
(74) *Attorney, Agent, or Firm* — Li & Cai Intellectual Property (USA) Office

(57) ABSTRACT

A thin heating device is provided. The thin heating device includes a first circuit board, a second circuit board, an elastic connector and a heating element. The first and second circuit boards are face-to-face arranged. The elastic connector connects the first and second circuit boards to apply a return force to hold an under-tested device. The heating element is mounted on the first or the second circuit board to heat the under-tested device.

11 Claims, 4 Drawing Sheets

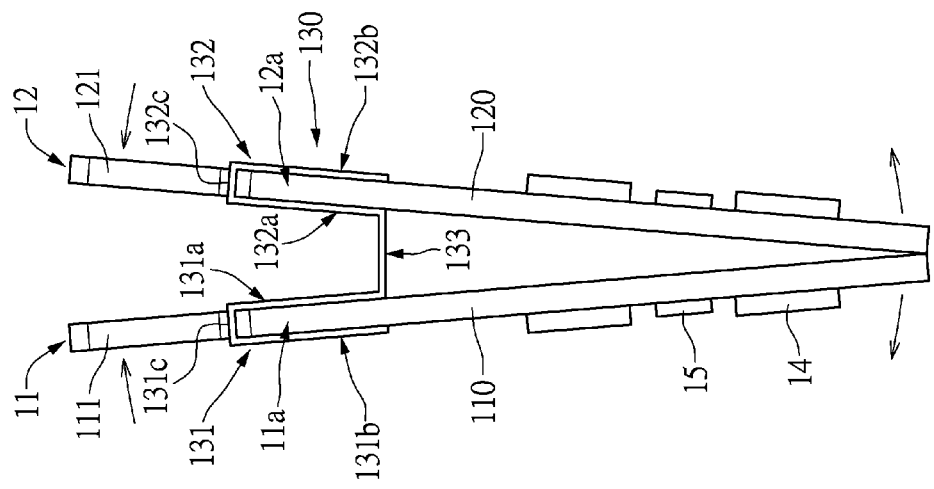
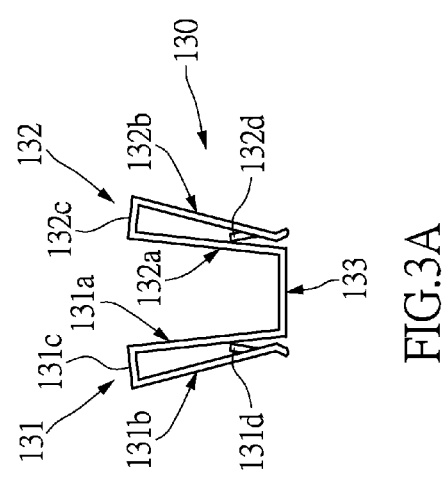

THIN HEATING DEVICE

BACKGROUND OF THE INVENTION

1. Field of the Invention

The present invention relates to a heating device; in particular, to a thin thermo-controlling heating device.

2. Description of Related Art

Before packaged integrated circuit elements or memory modules are shipped, a burn-in test is usually carried out to evaluate the stability of the aforementioned elements while operating in high-temperature. In the so-called burn-in test, the products are placed in a predetermined high temperature ambience and an electrical test is performed. Through the Burn-in test, the early fail products could be screened out before shipping, and further the quality of the shipped products may be ensured.

The conventional method of testing includes the following steps of feeding the memory modules have been tested in room temperature together with the motherboard for test into the oven, and then, testing the performances of the memory modules, the motherboard and the processor (CPU) in different predetermined temperature through setting the oven temperature. But during the testing process, the memory module, the motherboard and processors for test are heated together, the durability of the motherboard and the processors may be shortened, and the malfunctions of the motherboard and the processors may be caused.

Once the malfunctions of the motherboard or the processors happened during the process of Burn-in testing, it will cause the distorted test results of the memory modules.

SUMMARY OF THE INVENTION

The instant disclosure provides a thin heating device. The thin heating device includes a first circuit board, a second circuit board, an elastic connector and a heating element. The first circuit board and the second circuit board are connected to the elastic connector, and the first circuit board and the second circuit board are disposed facing each other. The elastic connector connects to the first circuit board and the second circuit board so that the first circuit board and the second circuit board hold a DUT (device under test) by a return force of the elastic connector. The heating element is disposed on the first circuit board or the second circuit board and is used for heating the DUT.

The thin heating device of the instant disclosure is by combining the two circuit boards with the elastic connector, and a heating clip tool to heat the DUT is fabricated. In addition, the motherboard and processors for testing the memory modules need not to be heated simultaneously while the memory modules in burn-in test. Therefore, the durability of the motherboard and processors may be prolonged. Besides, the motherboard and processors do not have to operate in high-temperature conditions, hence, the probability of malfunctions of the motherboard and processors used in test may be decreased.

In order to further the understanding the techniques, methods, and efficacy taken in the present invention to achieve the purpose, the following embodiments are provided along with specifications, illustrations, objects features and characteristics to facilitate the disclosure of the present invention. However, the accompanying drawings and attachments are only provided for reference and description and not intended to limit the present invention.

BRIEF DESCRIPTION OF THE DRAWINGS

FIG. 3A shows a side view of the holding member holding the first circuit board and the second circuit board;

FIG. 3B shows a side view of the holding member in use; and

DETAILED DESCRIPTION OF THE PREFERRED EMBODIMENTS

Figure 1:
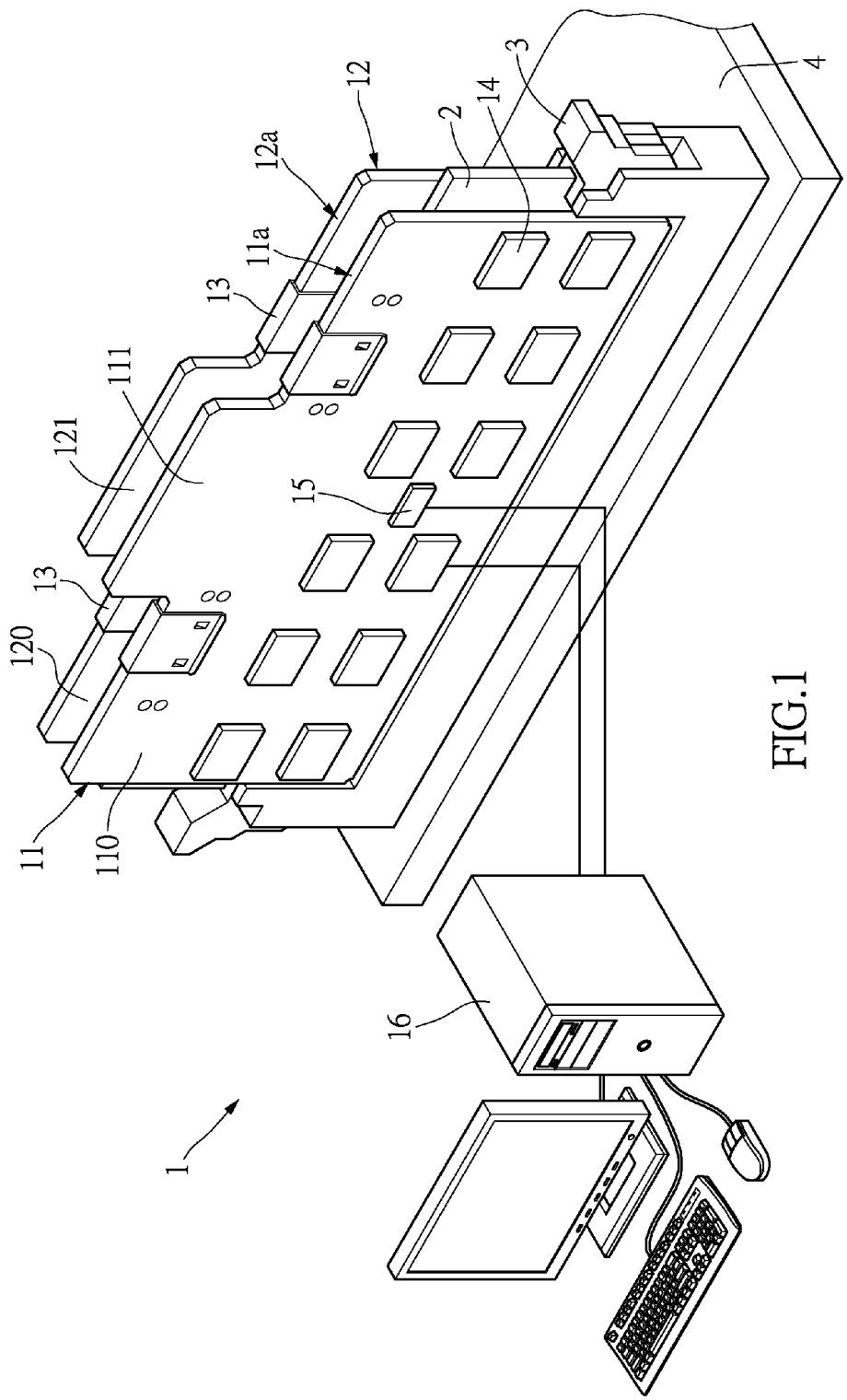
FIG. 1 shows a perspective view of the thin heating device holding the DUT according to an embodiment of the instant disclosure.

Referring to FIG. 1, a perspective view of the thin heating device according to an embodiment of the present invention. The thin heating device 1 of the present embodiment is used to hold a DUT 2 and heat the DUT 2 in burn-in test. The DUT 2, for example, could be memory modules, motherboards, graphics cards, sound cards or memory cards (such as DRAM), or other packaged components which are shaped of card or plate. The DUT 2 is a DRAM memory card in the instant embodiment. In one embodiment, a seat 3 is disposed on the motherboard 4, which is used in the test. A slot is formed on the seat 3 for receiving the DUT 2 for testing. The internal wires are configured in the inner of the seat 3 so that the transmission of the electrical signals between the DRAM memory card and the motherboard is allowed when the DRAM memory is plugged into the slot of the seat 3.

The thin heating device 1 of the present embodiment includes a first circuit board 11, a second circuit board 12, an elastic connector 13, at least one heating element 14, a temperature sensing element 15 and a processing module 16.

The elastic connector 13 connects the first and second circuit boards 11, 12 such that the first and second circuit boards 11, 12 are facing each other. When a force is applied to the elastic connector 13 and the elastic connector 13 deforms, the force imparts to the first circuit board 11 and the second circuit board 12. The return force of the elastic connector 13 facilitates the first and second circuit boards 11, 12 holding the DUT 2 therebetween.

Specifically, the first circuit board 11 includes a first holding part 110 and a first pressing part 111, and the second circuit board 12 includes a second holding part 120 and a second pressing part 121, wherein the first pressing part 111 is connected to the first holding part 110 and the second pressing part 121 is connected to the second holding part 120. The first pressing part 111 is located on a first side 11a of the first circuit board 11, and the second pressing part 121 is located on a second side 12a of the second circuit board 12, wherein the first side 11a is adjacent to the second side 12a. Specifically, the first pressing part 111 protrudes from a side edge of the first holding part 110 and the second pressing part 121 protrudes from the second holding part 120.

When the first circuit board 11 and the second circuit board 12 are face-to-face arranged, the first pressing part 111 is set relative to the second pressing part 121, and the first holding part 110 is set relative to the second holding part 120. The first holding part 110 and the second holding part 120 are used for holding the DUT 2. When the first pressing part 111 and the second pressing part 121 are pressed, the elastic connector 13 forces the first holding part 110 and the second holding part 120 to be in an open state to release the DUT 2.

In the embodiment of the instant disclosure, the elastic connector 13 is set on the first side 11a of the first circuit board 11 and the second side 12a of the second circuit board 12. In detail, the elastic connector 13 and the first pressing part 111 are set at the same side of the first circuit board 11. The first holding part 110 is connected to the second holding part 120 through the elastic connector 13. The first holding part 110 and the second holding part 120 could be in an open state when a force is applied to the elastic connector 13. The first holding part 110 and the second holding part 120 are in a close state when the return force of the elastic connector 13 is applied to the first and the second circuit boards 11, 12.

Figure 2:
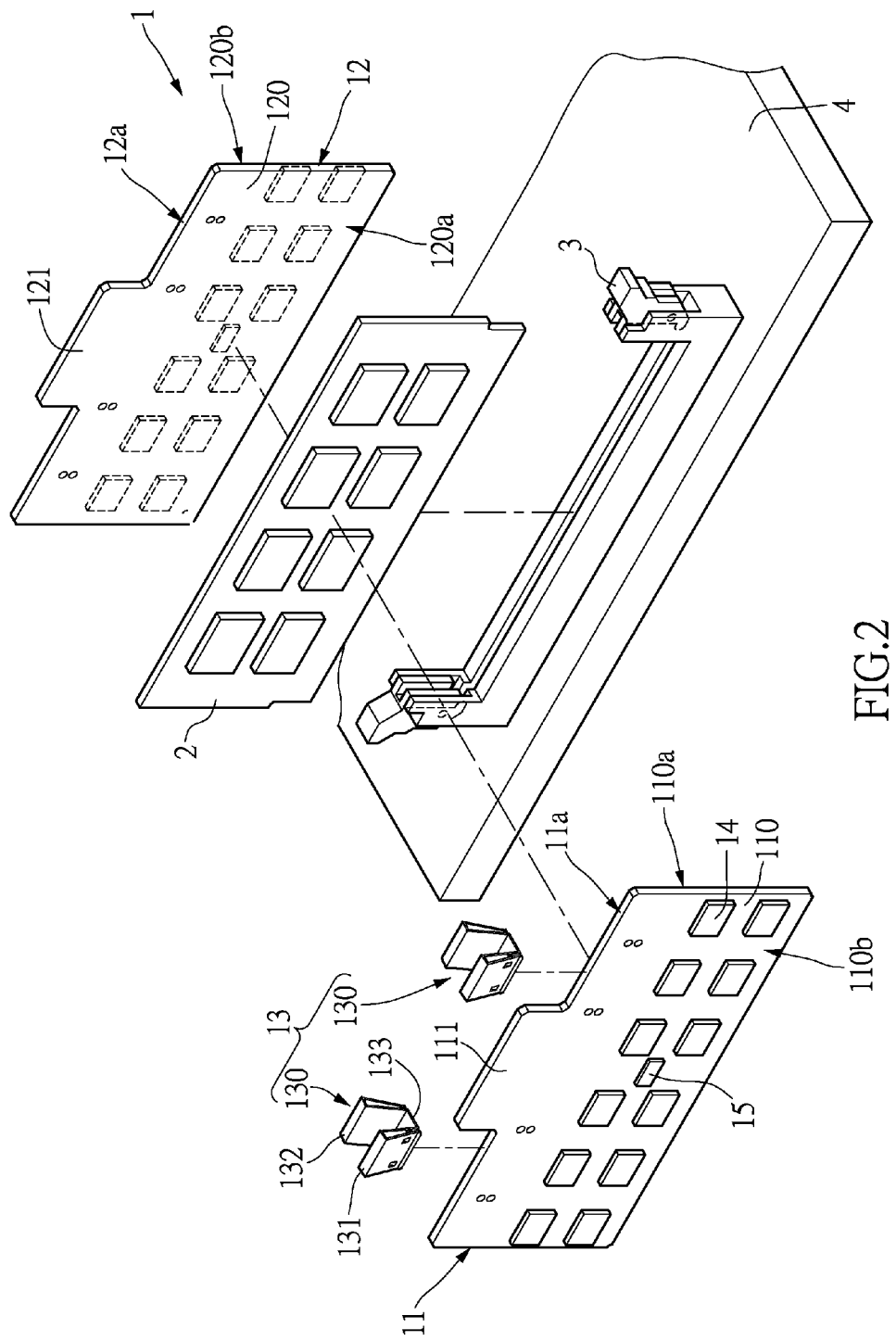
FIG. 2 shows an exploded diagram of the thin heating device according to an embodiment of the instant disclosure.

Referring to FIG. 2 shows a perspective exploded view of the thin heating device of an embodiment of the instant disclosure. In the embodiment of the instant disclosure, the elastic connector 13 includes two holding members 130, wherein the two holding members 130, the first pressing part 111 and the second pressing part 121 are located on the same side of the first circuit board 11, and both of the first pressing part 111 and the second pressing part 121 are arranged between the two holding members 130.

In detail, the holding member 130 includes two clips 131, 132 and a connecting part 133, wherein the clips 131, 132 are used for holding the first circuit board 11 and the second circuit board 12 respectively and connected to each other by the connecting part 133. In one embodiment, the clips 131, 132 and the connecting part 133 are formed integrally, and all are elastic steel.

Each of the clips 131, 132 includes a pair of clip sheets, and each of the clip sheets has a connecting end and a free end opposite thereto, wherein for the same clip, these clip sheets are arranged facing each other and connected to each other by these connecting ends.

Specifically, refer to FIG. 3A and FIG. 3B. FIG. 3A shows a side view of the holding member holding the first circuit board and the second circuit board; FIG. 3B shows a side view of the holding member in use. In FIG. 3A, each of the clips 131, 132 has a first clip sheet 131a, 132a and a second clip sheet 131b, 132b. The clip 132 is similar to the clip 131 in structure and the same description is omitted and the clip 131 is further elaborated herein.

As shown in FIG. 3A, the first clip sheet 131a and the second clip sheet 131b of the clip 131 are disposed facing each other, and the connecting ends of the first clip sheet 131a and second clip sheet 131b are connected to each other to make the clip 131 have an engaging end 131c, and the free ends of the first clip sheet 131a and the clip sheet 131b form an opening end of the clip 131. As viewed in this Figure, the clip 131 is a U-shaped clip with a downward opening.

In addition, the distance between the first clip sheet 131a and the second clip sheet 131b of the clip 131 is decreasing from the engaging end 131c to the opening end. That is, the extending directions of the first clip sheet 131a and the second clip sheet 131b meet at a line. When the first circuit board 11 or the second circuit board 12 is placed into the space between the first and second clip sheets 131a, 131b from the opening end, the first circuit board 11 or the second circuit board 12 would be fastened by the return force of the first clip sheet 131a and the second clip sheet 131b. The structure of the clip 132 is the same as the clip 131.

In this embodiment, each clip 131, 132 further includes an elastic sheet 131d, 132d, the elastic sheet 131d, 132d are elastically connected to the inner wall of the first clip sheet 131a, 132a or the second clip sheet 131b, 132b, and can further assist the clip 131,132 to latch the first circuit board 11 or the second circuit board 12. Further explanation, the elastic sheet 131d, 132d and the inner wall of the first clip sheet 131a, 132a or the second clip sheet 131b, 132b form an angle greater than zero, and the elastic sheet 131d, 132d extend from the inner wall of the first clip sheet 131a, 132a or the second clip sheet 131b, 132b toward the engaging end 131c, 132c to allow the entry of the first circuit board 11 or the second circuit board 12 from the opening end. When the first circuit board 11 is held by the first clip sheet 131a and the second clip sheet 131b, the elastic sheet 131d abuts against the first circuit board 11 by the return force, and the second circuit board 12 is held by the first clip sheet 132a and the second clip sheet 132b in the same manner.

In addition, refer to FIG. 3A. FIG. 3A shows the aforementioned connecting part 133 is connected to between the free ends of the two adjacent clips 131 and 132. That is, the connecting part 133 extends from the free end of the first clip sheet 131a of one of the clip 131 to the free end of the first clip sheet 132a of another clip 132. The engaging end 131c, 132c of these clips 131, 132 are abreast, and the connected two free ends of the first clip sheets 131a, 132a are abreast and located between the other two free ends of the second clip sheets 131b, 132b. That is to say, the two clips 131, 132 open toward the same direction.

Besides, as shown in FIG. 3A, the extending direction of the first clip sheet 131a of one of the clip 131 meets the extending direction of the clip sheet 132a of another clip 132. Referring to FIG. 3B, after the first circuit board 11 and the second circuit board 12 are held by the clip 131,132 and before the DUT 2 is held, the extending planes of the first holding part 110 and the second holding part 120 meet each other thus in a close state.

The structure of the elastic connector 13 and the circuit board are not limited to the above embodiment. In another embodiment, the first circuit board 11 and the second circuit board 12 are not equipped with the first pressing part 111 or the second pressing part 121. However, the elastic connector 13 includes two pressing sheets, an axis pin and a spring, wherein each pressing sheet has at least one pivot hole. The two pressing sheets are pivotally connected to each other by the axis pin and the spring going through the pivot hole. Each pressing sheet further includes an engaging part so that the elastic connector 13 is fastened on the first circuit board 11 and the second circuit board 12 by the engaging part. In this embodiment, the pressing sheet of the elastic connector 13 is made of heat-resistant or heat insulating material.

Referring to FIG. 1 again, the perspective view of the thin heating device 1 holding the DUT 2 is shown. When the first holding part 110 and the second holding part 120 hold the DUT 2, the return force of the clip 131,132 makes the first holding part 110 and the second holding part 120 apply a force to the two opposite sides of the DUT 2 respectively and fasten the DUT 2 so that the inner surface 110a of the first holding part 110 and the inner surface 120a of the second holding part 120 abut against the opposite two sides of the DUT 2.

Referring to FIG. 2 again, the outer surface 110b of the first holding part 110 and the outer surface 120b of the second holding part 120 according to the present embodiment are used for arranging lay-out or setting functional elements.

In detail, the heating element 14, for heating the DUT 2, is disposed on the outer surface 110b of the first holding part 110 or the outer surface 120b of the second holding part 120. The heating element 14 may be any component the temperature of which is increasing with the increasing applied energy, such as an impedance element or a ceramic heating element and the like. In the embodiment of the instant disclosure, the heating element 14 is used to heat the first circuit board 11 and the second circuit board 12 to a predetermined temperature. It is due to the effect of heat conduction, the DUT 2 held between the first circuit board 11 and the second circuit board 12 will be heated to a predetermined temperature.

In one embodiment, the DUT 2 is a memory module, and has been connected electrically to the motherboard 4 and the processor (CPU) for test. What should be mentioned is that the thin heating device 1 of the embodiment of the invention could directly hold the memory module, and heat it without simultaneously heating the motherboard 4 and the processor for test. Therefore, the malfunctions of the motherboard and processor in operation due to heat may be reduced, and thus the test results would be more correct.

In one embodiment of the instant disclosure, the temperature sensing element 15 is also disposed on the outer surface 110b of the first holding part 110 and/or the outer surface 120b of the second holding part 120 to monitor the real temperature of the DUT 2. The temperature sensing element 15 could be contact-type or noncontact-type, and the contact-type temperature sensing element such as thermocouples, resistance temperature sensors or thermistors. In another embodiment, the temperature sensing element 15 may also be disposed on the inner surface 110a of the first holding part 110 and/or the outer surface 120a of the second holding part 120 to evaluate the temperature of the DUT 2 directly. It should be noted that the temperature sensing element 15 is an optional component, and is not necessary to be provided on the circuit board.

Figure 4:
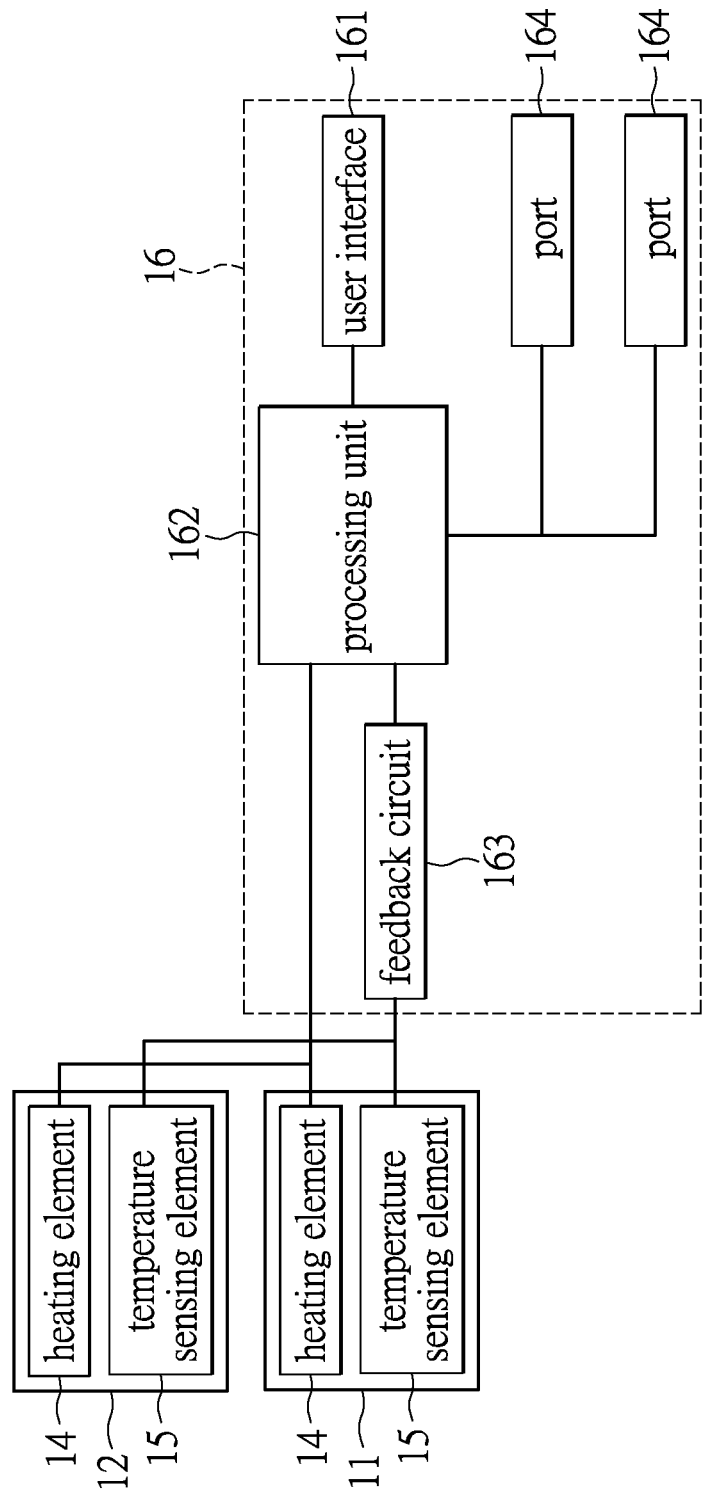
FIG. 4 shows a functional block diagram of the processing module according to FIG. 1 of an embodiment of the instant disclosure.

The processing module 16 is electrically connected to the heating element 14 and the temperature sensing element 15 so as to control the temperature of the heating elements 14 applied to the DUT 2 according to the temperature measured by the temperature sensing element 15. FIG. 4 shows a functional block diagram of the thin heating device according to an embodiment of the instant disclosure. The processing module 16 includes the user interface 161, the processing unit 162, the feedback circuit 163 and port 164.

The processing unit 162 includes a plurality of built-in programs, and the processing unit 162 is electrically coupled to the user interface 161, the heating element 14 and the temperature sensing element 15, wherein the processing unit 162 is electrically connected to the temperature sensing element 15 through the feedback circuit 163. The predetermined parameters inputted by a user are received through the user interface 161 and then sent to the processing unit 162. The aforesaid parameters may be the heating temperature, the heating rate, the retention time and so on. Subsequently, according to the parameters inputted by the user, the processing unit 162 controls the heating temperature through the heating element 14, thereby to test the DUT 2.

During the heating process, the temperature sensing element 15 transfers the measured temperature of the first circuit board 11 or the second circuit board 12, through the feedback circuit 163 back to the processing unit 162 in signal mode. The built-in programs of the processing unit 162 can automatically regulate the temperature of the heating element 14 according to the signals transferred by the temperature sensing element 15 through the feedback circuit 163. In this embodiment, port 164 could be a USB interface or a RS232 serial port, for selectively connecting external device, such as the detecting instruments of the memory modules, to control the heating parameters based on the measured data.

In summary, the thin heating device of the instant disclosure is elastically and pivotally engaged the two circuit boards to form a heating clip tool to heat the DUT. When the memory modules under the test condition, the thin heating device of the instant disclosure can hold and heat the memory modules without simultaneously heating the motherboard and processor, and thus the durability of the motherboard and the processor may be prolonged. And the motherboard and the processor do not have to operate in high-temperature, thus the probability of malfunctions of the motherboard and the processor may be reduced, and the test results of the memory modules could be more accurate.

Furthermore, in the conventional burn-in test, the DUT is placed inside of the oven and not sure for contacting with the heating source, so there is an error value between the predetermined temperature and the heating temperature for DUT in reality. In other words, the heating temperature may be less than the predetermined temperature. It may let the originally impassible DUT pass the test and may result the quality authentication decreases. The thin heating device of an embodiment of the instant disclosure heats and holds the DUT by the two circuit boards. It is due to the direct contact between the circuit board and the DUT, there is a better thermal conduction between the circuit board and the DUT. Therefore, the decreasing of the error between the temperature of the DUT and the predetermined temperature could enhance the quality discrimination. Further, by using the feedback circuit, the thin heating device of the instant disclosure could be auxiliary to control temperature. Furthermore, since the thickness of the circuit board can be made to less than 0.5 mm, the thin heating device of the embodiment of instant disclosure is more convenient compared to conventional oven.

The foregoing is only preferred possible embodiments of the present invention, where any modifications and alterations in accordance with the claims of the present invention are also belong to the scope of the present invention.

What is claimed is:

1. A thin heating device comprising:
   at least an elastic connector;
   a first circuit board and a second circuit board are connected by the elastic connector such that the first circuit board and the second circuit board are facing each other, wherein the elastic connector deforms, and a return force of the elastic connector facilitates the first circuit board and the second circuit board holding a DUT (device under test) therebetween; and
   at least a heating element disposed on the first circuit board or the second circuit board for heating the DUT;
   wherein the first circuit board comprises a first pressing part and a first holding part, and the second circuit board comprises a second pressing part and a second holding part, wherein the first pressing part protrudes from the first holding part and the second pressing part protrudes from the second holding part, and the first holding part and the second holding part are used to hold the DUT, and when the first pressing part and the second pressing part are pressed, the elastic connector makes the first holding part and the second holding part in an open state.

2. The thin heating device according to claim 1, further comprising:
   a temperature sensing element disposed on the first circuit board or the second circuit board;
   a processing module electrically coupled to the heating element and the temperature sensing element, wherein the processing module controls a DUT heating temperature through the heating element according to a temperature detected by the temperature sensing element.

3. The thin heating device according to claim 2, further comprising a feedback circuit, wherein the temperature sensing element electrically connects to the processing module through the feedback circuit, and the processing module controls the DUT heating temperature through the heating element according to a signal from the feedback circuit.

4. The thin heating device according to claim 1, wherein the elastic connector comprises two holding members, wherein the holding members and the first pressing part are located at the same side of the first holding part, and the first pressing part and the second pressing part are located between the two holding members.

5. The thin heating device according to claim 4, wherein when the two holding members hold the first circuit board and the second circuit board respectively, and the first circuit board and the second circuit board do not hold the DUT, the extension plane of the first circuit board and the extension plane of the second circuit board meet at a line.

6. The thin heating device according to claim 1, wherein the elastic connector includes at least one holding member which comprises two clips and a connecting part connected therebetween, and the clips hold the first circuit board and the second circuit board respectively.

7. The thin heating device according to claim 6, wherein each of the clips includes a pair of clip sheets, and each of the clip sheets has a connecting end and a free end opposite thereto, wherein the clip sheets are arranged facing each other and connected to each other by the connecting ends.

8. The thin heating device according to claim 7, wherein the connecting part extends from the free end of one of the clip sheets to the free end of another clip sheet, and the connected two free ends are abreast the other two free ends.

9. The thin heating device according to claim 8, wherein the two clips open toward the same direction.

10. The thin heating device according to claim 7, wherein each of the clips further comprises an elastic sheet elastically connected to an inner wall of one of the two clip sheets, and when the first circuit board or the second circuit board are held by the pair of clip sheets, the elastic sheet abuts the first circuit board or the second circuit board.

11. The thin heating device according to claim 7, wherein when the clips do not hold the first circuit board and the second circuit board, the extending planes of the two clip sheets of each of the clips meet each other.

* * * * *